(12) United States Patent
Yap et al.

(10) Patent No.: US 9,331,654 B2
(45) Date of Patent: May 3, 2016

(54) DUAL SQUELCH DETECTORS AND METHODS FOR LOW POWER STATES

(71) Applicant: Marvell World Trade Ltd., St. Michael (BB)

(72) Inventors: Christopher Yap, San Francisco, CA (US); Jingyu Huang, Sunnyvale, CA (US)

(73) Assignee: Marvell World Trade Ltd., St. Michael (BB)

( * ) Notice: Subject to any disclaimer, the term of this patent is extended or adjusted under 35 U.S.C. 154(b) by 85 days.

(21) Appl. No.: 13/848,817

(22) Filed: Mar. 22, 2013

(65) Prior Publication Data

US 2013/0251016 A1    Sep. 26, 2013

Related U.S. Application Data

(60) Provisional application No. 61/615,784, filed on Mar. 26, 2012.

(51) Int. Cl.
*H04B 14/06* (2006.01)
*H03G 3/34* (2006.01)
*G06F 1/32* (2006.01)

(52) U.S. Cl.
CPC .............. *H03G 3/342* (2013.01); *G06F 1/3209* (2013.01); *G06F 1/3253* (2013.01); *Y02B 60/1235* (2013.01)

(58) Field of Classification Search
None
See application file for complete search history.

(56) References Cited

U.S. PATENT DOCUMENTS

| 2005/0054311 | A1  | 3/2005 | Komatsu et al. |         |
|--------------|-----|--------|----------------|---------|
| 2009/0083587 | A1* | 3/2009 | Ng et al.      | 714/47  |
| 2010/0081406 | A1* | 4/2010 | Tan et al.     | 455/218 |

FOREIGN PATENT DOCUMENTS

DE    102011089875 A1    7/2012

OTHER PUBLICATIONS

PCT International Search Report for corresponding Application No. PCT/US2013/033711; Jun. 28, 2013; 4 pages.

* cited by examiner

*Primary Examiner* — Chieh M Fan
*Assistant Examiner* — Wednel Cadeau

(57) ABSTRACT

An apparatus includes a first squelch circuit and a second squelch circuit. The first squelch circuit is configured to detect possible squelch signals in a communication signal. The second squelch circuit is configured to selectively detect the possible squelch signals in the same communication signal. The second squelch circuit is further configured to operate in a low-power state responsive to the first squelch circuit detecting none of the possible squelch signals in the communication signal. The second squelch circuit is further configured to operate in a high-power state responsive to the first squelch circuit detecting one of the possible squelch signals in the communication signal.

18 Claims, 6 Drawing Sheets

DUAL SQUELCH DETECTORS AND METHODS FOR LOW POWER STATES

CROSS-REFERENCE TO RELATED APPLICATIONS

This disclosure claims the benefit of U.S. Provisional Patent Application Ser. No. 61/615784, filed on Mar. 26, 2012, entitled "DUAL SQUELCH DETECTOR ARCHITECTURE FOR SATA ATA LOW POWER STATES," the disclosure thereof incorporated by reference herein in its entirety.

FIELD

The present disclosure relates generally to the field of digital communication. More particularly, the present disclosure relates to reducing power consumption in communication devices employing squelch detectors.

BACKGROUND

This background section is provided for the purpose of generally describing the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

The Serial ATA (SATA) interface defines power states that a SATA device or host (both occasionally referred to herein as "SATA devices") can enter to reduce power consumption. Out-of-band (OOB) signals received by a squelch detector are used to communicate during these low-power states. In the lowest-power states, power consumption is limited by the power used by the squelch detector. The SATA specification defines minimum and maximum amplitudes at which to reject and detect the OOB signals, as well as minimum and maximum durations for elements of the OOB signals used to determine OOB signaling sequences such as COMINIT, COMRESET, and COMWAKE. The squelch detector must consume power to correctly measure these amplitudes and durations, significantly increasing the power consumption of SATA devices in low-power states.

SUMMARY

In general, in one aspect, an embodiment features an apparatus comprising: a first squelch circuit configured to detect possible squelch signals in a communication signal; and a second squelch circuit configured to i) operate in a low-power state responsive to the first squelch circuit detecting none of the possible squelch signals in the communication signal, and ii) operate in a high-power state responsive to the first squelch circuit detecting one of the possible squelch signals in the communication signal.

Embodiments of the apparatus can include one or more of the following features. In some embodiments, the second squelch circuit is further configured to: iii) determine an out-of-band (OOB) signaling sequence based on a squelch signal in the communication signal responsive to operating in the high-power state. In some embodiments, the first squelch circuit comprises: a first squelch detector configured to detect one of the possible squelch signals in the communication signal responsive to an amplitude of the one of the possible squelch signals being greater than a threshold amplitude. In some embodiments, the second squelch circuit comprises: a second squelch detector configured to detect the squelch signal in the communication signal responsive to i) the first squelch detector detecting one of the possible squelch signals in the communication signal, ii) an amplitude of the squelch signal being greater than a first threshold amplitude, and iii) the amplitude of the squelch signal being less than a second threshold amplitude, wherein the second threshold amplitude is greater than the first threshold amplitude. In some embodiments, the communication signal is selected from the group consisting of: a serial ATA (SATA) signal; a PCI Express (PCIe) signal; and a Universal Serial Bus (USB) signal.

In general, in one aspect, an embodiment features a method comprising: detecting possible squelch signals in a communication signal in a first squelch circuit; operating a second squelch circuit in a low-power state responsive to detecting none of the possible squelch signals in the communication signal in the first squelch circuit; and operating the second squelch circuit in a high-power state responsive to detecting one of the possible squelch signals in the communication signal in the first squelch circuit.

Embodiments of the method can include one or more of the following features. Some embodiments comprise determining an out-of-band (OOB) signaling sequence based on one of the possible squelch signals responsive to operating in the high-power state. Some embodiments comprise detecting one of the possible squelch signals in the communication signal responsive to an amplitude of the one of the possible squelch signals being greater than a threshold amplitude. Some embodiments comprise detecting a squelch signal in the communication signal responsive to i) detecting one of the possible squelch signals in the communication signal, ii) an amplitude of the squelch signal being greater than a first threshold amplitude, and iii) the amplitude of the squelch signal being less than a second threshold amplitude, wherein the second threshold amplitude is greater than the first threshold amplitude. In some embodiments, the communication signal is selected from the group consisting of: a serial ATA (SATA) signal; a PCI Express (PCIe) signal; and a Universal Serial Bus (USB) signal.

The details of one or more implementations are set forth in the accompanying drawings and the description below. Other features will be apparent from the description and drawings, and from the claims.

Figure 1:
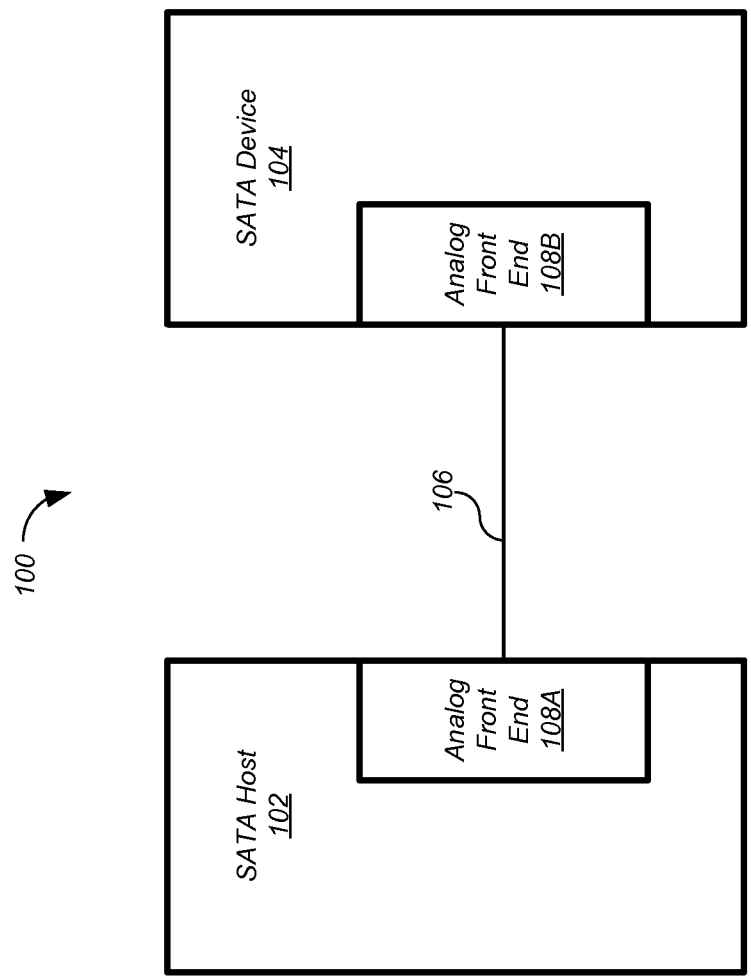
FIG. 1 shows elements of a computing system according to one embodiment.

The leading digit(s) of each reference numeral used in this specification indicates the number of the drawing in which the reference numeral first appears.

DETAILED DESCRIPTION

Embodiments of the present disclosure feature dual squelch detectors, and corresponding methods, that significantly lower the power required for squelch detection in low-power states. Although the disclosed embodiments are discussed in terms of Serial ATA (SATA) devices, the techniques disclosed herein apply to other sorts of signals as well, including PCI Express (PCIe) signals, Universal Serial Bus (USB) signals, and the like.

FIG. 1 shows elements of a computing system 100 according to one embodiment. Although in the described embodiments the elements of the computing system 100 are presented in one arrangement, other embodiments may feature other arrangements. For example, elements of the computing system 100 can be implemented in hardware, software, or combinations thereof.

Referring to FIG. 1, the computing system 100 includes a SATA host 102 connected to a SATA device 104 by a cable 106. The SATA host 102 can be implemented, for example, as a personal computer or the like. The SATA device 104 can be implemented, for example, as a hard disk drive or the like. The cable 106 can be implemented, for example, as a flexible printed cable or the like. Both the SATA host 102, and the SATA device 104, include a respective SATA analog front end 108A,B that is connected to the cable 106. Together the SATA analog front ends 108A,B and the cable 106 provide a SATA link.

Figure 2:
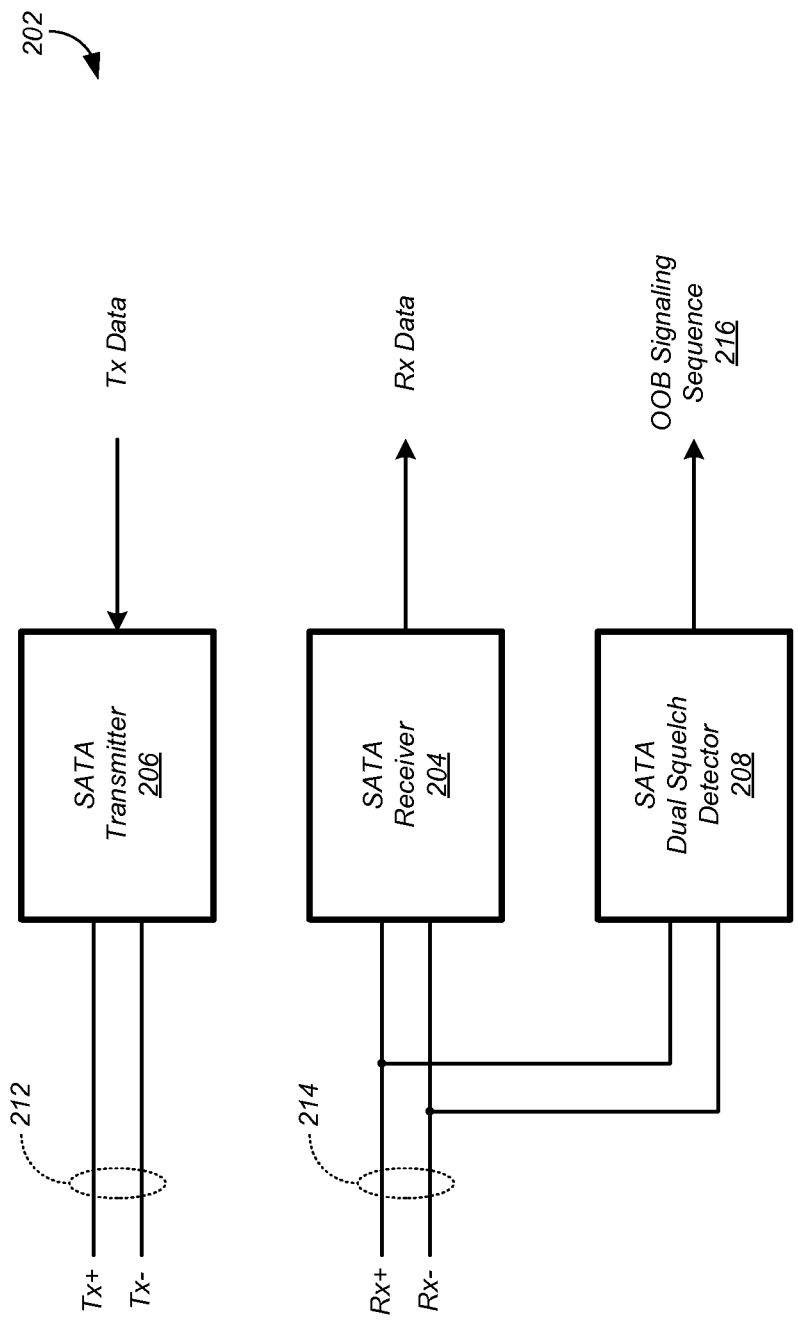
FIG. 2 shows detail of a SATA analog front end according to one embodiment.

FIG. 2 shows detail of a SATA analog front end 202 according to one embodiment. Although in the described embodiments the elements of the SATA analog front end 202 are presented in one arrangement, other embodiments may feature other arrangements. For example, elements of the SATA analog front end 202 can be implemented in hardware, software, or combinations thereof. The SATA analog front end 202 can be used as one or both of the SATA analog front ends 108A,B of FIG. 1.

Referring to FIG. 2, the SATA analog front end 202 includes a SATA receiver 204, a SATA transmitter 206, and a SATA dual squelch detector 208. The SATA receiver 204, and the SATA transmitter 206, can be implemented according to conventional techniques. The SATA dual squelch detector 208 can be implemented as described below.

The SATA transmitter 206 receives data (Tx Data), and transmits a differential communication signal 212 on conductors Tx+ and Tx− that represents the data Tx Data over a SATA link. The SATA receiver 204 receives a differential communication signal 214 on conductors Rx+ and Rx− that represents data (Rx Data) over the SATA link, and recovers the data Rx Data from the differential communication signal 214. The SATA dual squelch detector 208 detects squelch signals on the conductors Rx+ and Rx−, and determines out-of-band (OOB) signaling sequences 216 based on the squelch signals. The OOB signaling sequences 216 can be used by a SATA host 102 or a SATA device 104 to recover from low-power states.

Figure 3:
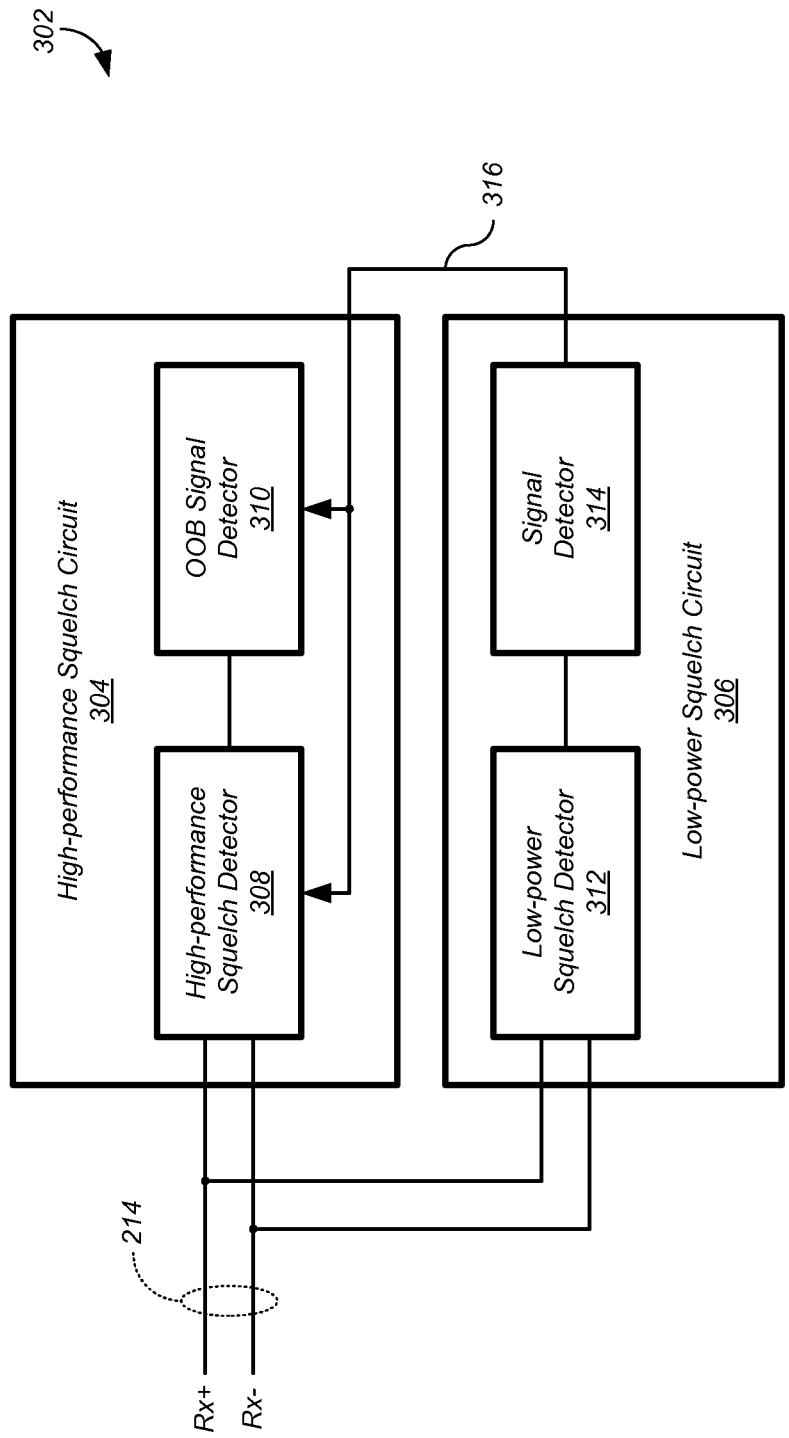
FIG. 3 shows detail of a SATA dual squelch detector according to one embodiment.

FIG. 3 shows detail of a SATA dual squelch detector 302 according to one embodiment. Although in the described embodiments the elements of the SATA dual squelch detector 302 are presented in one arrangement, other embodiments may feature other arrangements. For example, elements of the SATA dual squelch detector 302 can be implemented in hardware, software, or combinations thereof. The SATA dual squelch detector 302 can be used as the SATA dual squelch detector 208 of FIG. 2.

Referring to FIG. 3, the SATA dual squelch detector 302 includes two squelch circuits: a high-performance squelch circuit 304, and a low-power squelch circuit 306. The high-performance squelch circuit 304 is capable of operating in either a high-power state or a low-power state responsive to a control signal 316 provided by the low-power squelch circuit 306. In particular, the high-performance squelch circuit 304 operates in the high-power state responsive to negation of the control signal 316, and operates in the low-power state responsive to assertion of the control signal 316. The high-performance squelch circuit 304 detects squelch signals, and determines out-of-band (OOB) signaling sequences 216 based on the squelch signals, only while operating in the high-power state.

The high-performance squelch circuit 304 includes a high-performance squelch detector 308 and an out-of band (OOB) signal detector 310. The high-performance squelch detector 308, and the out-of band (OOB) signal detector 310, are each capable of operating in either a high-power state or a low-power state responsive to the control signal 316 provided by the low-power squelch circuit 306.

In particular, the high-performance squelch detector 308, and the OOB signal detector 310, operate in the high-power state responsive to negation of the control signal 316, and operate in the low-power state responsive to assertion of the control signal 316.

The high-performance squelch detector 308 detects squelch signals only while operating in the high-power state. The high-performance squelch detector 308 detects a squelch signal based on the amplitude of the squelch signal and two predetermined amplitude thresholds. In particular, the high-performance squelch detector 308 detects a squelch signal only when the amplitude of the squelch signal falls between the predetermined amplitude thresholds. In one embodiment, the predetermined threshold amplitudes may be 75 mV and 200 mV. In some embodiments, the high-performance squelch detector 308 detects squelch signals in compliance with all or part of the Serial ATA International Organization: Serial ATA Revision 3.0 specification, the disclosure thereof incorporated by reference herein in its entirety.

The OOB signal detector 310 determines OOB signaling sequences 216 based on squelch signals only while operating in the high-power state. In particular, the OOB signal detector 310 determines OOB signaling sequences 216 based on minimum and maximum durations for elements of the squelch signal. In some embodiments, the OOB signal detector 310 determines OOB signaling sequences 216 in compliance with all or part of the Serial ATA International Organization: Serial ATA Revision 3.0 specification.

The low-power squelch circuit 306 controls the power state of the high-performance squelch circuit 304 by asserting and negating the control signal 316. In particular, the low-power squelch circuit 306 negates the control signal 316 responsive to detecting a possible squelch signal, and asserts the control signal 316 otherwise. In this manner, the high-performance squelch circuit 304 is placed in the high-power state only when a possible squelch signal is detected.

The low-power squelch circuit 306 includes a low-power squelch detector 312 and a signal detector 314. The low-power squelch detector 312 detects a possible squelch signal based on the amplitude of the possible squelch signal and a predetermined threshold amplitude. In particular, the low-power squelch detector 312 detects a possible squelch signal only when the amplitude of the possible squelch signal is greater than a predetermined threshold amplitude. A signal exceeding the predetermined threshold amplitude may, or may not, be a squelch signal, and so is referred to herein as a "possible squelch signal." In one embodiment, the predetermined threshold amplitude may be 100 mV. The signal detector 314 negates the control signal 316 when the low-power squelch detector 312 detects a possible squelch signal in the inbound differential communication signal 214.

Figure 4:
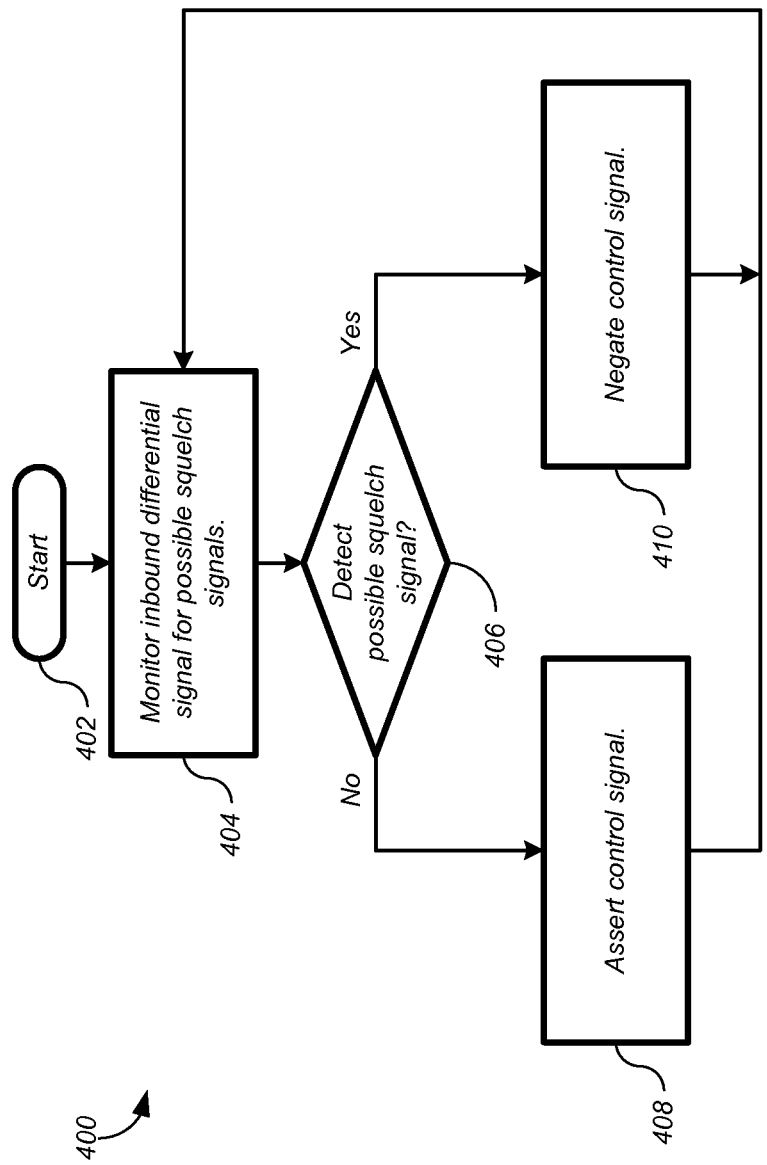
FIG. 4 shows a process for the low-power squelch circuit of FIG. 3 according to one embodiment.

FIG. 4 shows a process 400 for the low-power squelch circuit 306 of FIG. 3 according to one embodiment. Although in the described embodiments the elements of process 400 are presented in one arrangement, other embodiments may feature other arrangements. For example, in various embodiments, some or all of the elements of process 400 can be executed in a different order, concurrently, and the like. Also some elements of process 400 may not be performed, and may not be executed immediately after each other. In addition, some or all of the elements of process 400 can be performed automatically, that is, without human intervention.

Referring to FIG. 4, at 402, process 400 begins. At 404, the low-power squelch detector 312 monitors the inbound differential communication signal 214 for possible squelch signals. In particular, the low-power squelch detector 312 detects a possible squelch signal when the amplitude of the possible squelch signal is greater than a predetermined threshold amplitude.

At 406, responsive to the low-power squelch detector 312 detecting no possible squelch signals, at 408 the signal detector 314 asserts, or continues to assert, the control signal 316. But at 406, responsive to the low-power squelch detector 312 detecting a possible squelch signal, at 410 the signal detector 314 negates the control signal 316.

Figure 5:
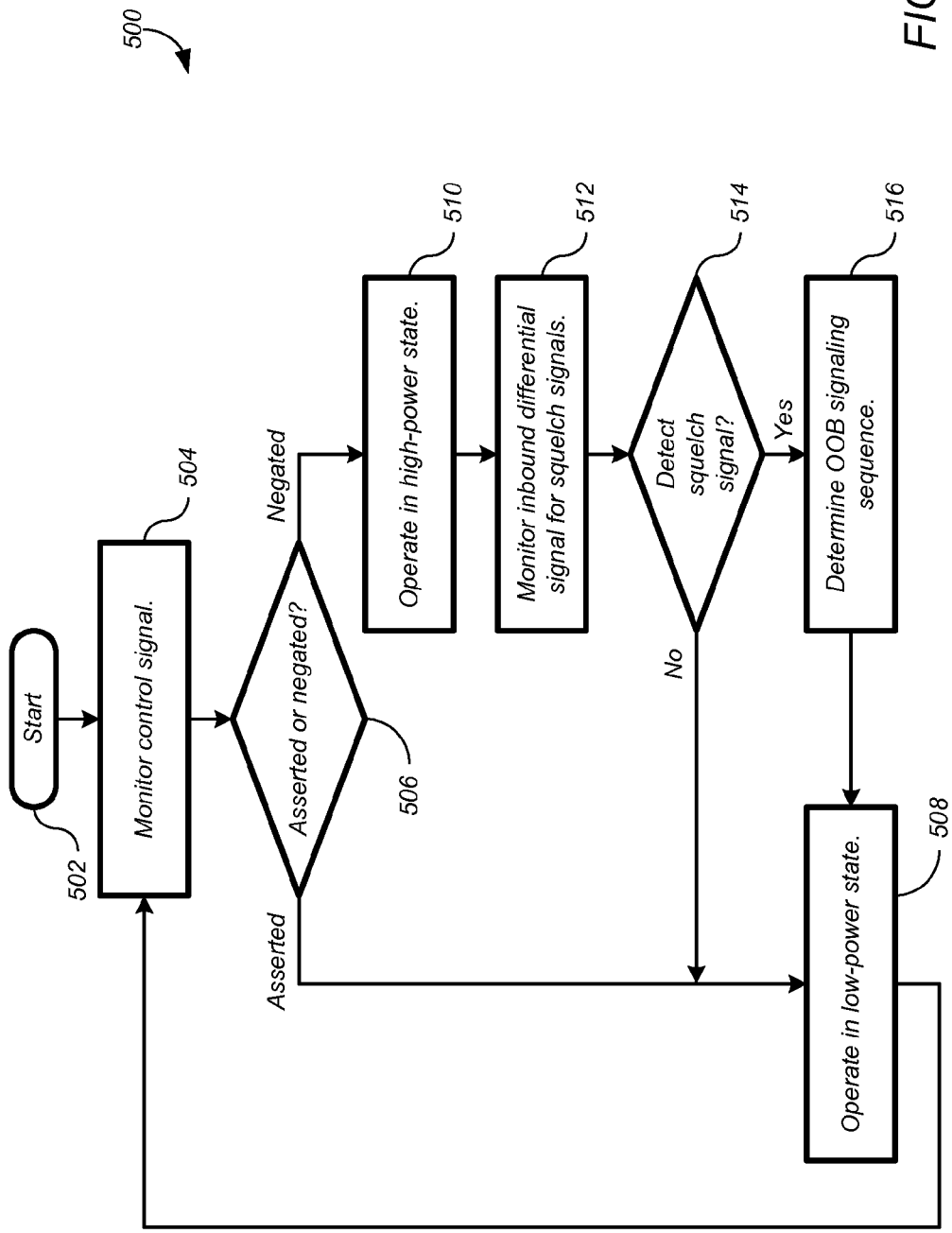
FIG. 5 shows a process for the high-performance squelch circuit of FIG. 3 according to one embodiment.

FIG. 5 shows a process 500 for the high-performance squelch circuit 304 of FIG. 3 according to one embodiment. Although in the described embodiments the elements of process 500 are presented in one arrangement, other embodiments may feature other arrangements. For example, in various embodiments, some or all of the elements of process 500 can be executed in a different order, concurrently, and the like. Also some elements of process 500 may not be performed, and may not be executed immediately after each other. In addition, some or all of the elements of process 500 can be performed automatically, that is, without human intervention.

Referring to FIG. 5, at 502, process 500 begins. At 504, the high-performance squelch detector 308, and the OOB signal detector 310, monitor the control signal 316. At 506, responsive to detecting the control signal being asserted, at 508, the high-performance squelch detector 308, and the OOB signal detector 310, operate in the low-power state. In the low-power state, the circuits in the high-performance squelch detector 308, and the OOB signal detector 310, can be powered off, except for those circuits required to monitor the control signal 316, and to power on the remaining circuits responsive to detecting the control signal 316 being negated. Then, at 504, the high-performance squelch detector 308, and the 008 signal detector 310, continue to monitor the control signal 316.

At 506, responsive to detecting the control signal being negated, at 510, the high-performance squelch detector 308, and the OOB signal detector 310, operate in the high-power state. In the high-power state, the circuits in the high-performance squelch detector 308, and the OOB signal detector 310, are powered on and fully functional. Then, at 512, the high-performance squelch detector 308 monitors the inbound differential communication signal 214 for squelch signals. In particular, the high-performance squelch detector 308 detects a squelch signal when the amplitude of the squelch signal is greater than a predetermined minimum threshold amplitude and less than a predetermined maximum threshold amplitude.

At 514, responsive to the high-performance squelch detector 308 detecting no squelch signal during a predetermined interval, at 508, the high-performance squelch detector 308, and the OOB signal detector 310, operate in the low-power state. Then, at 504, the high-performance squelch detector 308, and the OOB signal detector 310, continue to monitor the control signal 316.

At 514, responsive to the high-performance squelch detector 308 detecting a squelch signal during the predetermined interval, at 516, the OOB signal detector 310 determines an OOB signaling sequence 216 based on the squelch signal. For example, the OOB signal detector 310 determines a SATA OOB signaling sequence 216 such as COMMIT, COMRESET, and COMWAKE. Then, at 508, the high-performance squelch detector 308, and the OOB signal detector 310, operate in the low-power state. Then, at 504, the high-performance squelch detector 308, and the OOB signal detector 310, continue to monitor the control signal 316.

Figure 6:
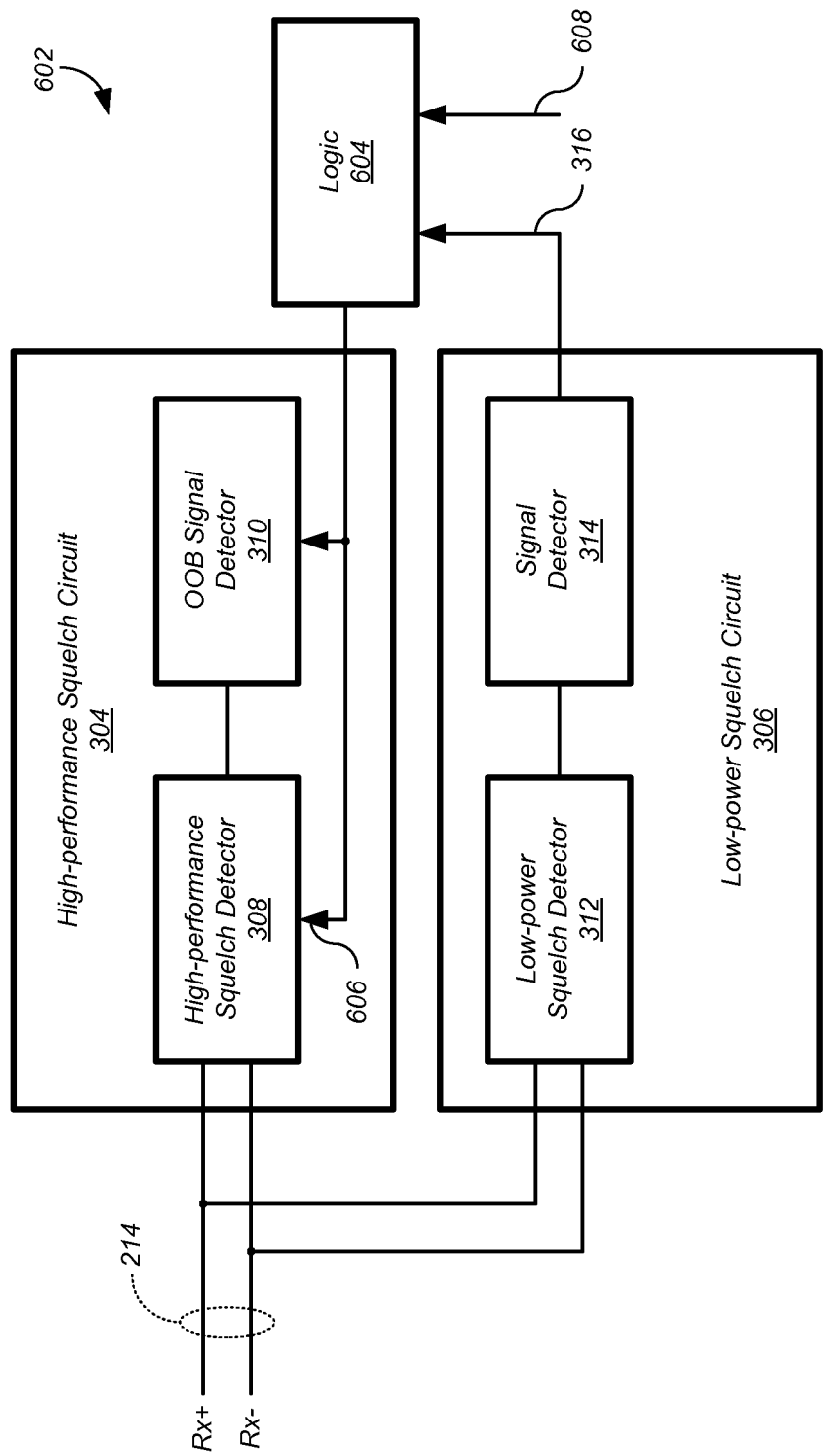
FIG. 6 shows detail of a SATA dual squelch detector according to an embodiment where the high-performance squelch circuit enters the high-power state only when an enable signal is asserted.

In some embodiments, the high-performance squelch circuit 304 enters the high-power state only when an enable signal is asserted. FIG. 6 shows detail of a SATA dual squelch detector 602 according to one such embodiment. Although in the described embodiments the elements of the SATA dual squelch detector 602 are presented in one arrangement, other embodiments may feature other arrangements. For example, elements of the SATA dual squelch detector 602 can be implemented in hardware, software, or combinations thereof. The SATA dual squelch detector 602 can be used as the SATA dual squelch detector 208 of FIG. 2.

Referring to FIG. 6, the SATA dual squelch detector 602 is similar to the SATA dual squelch detector 302 of FIG. 3, but with the addition of logic 604. Logic 604 negates a control signal 606 only when the control signal 316 is negated, and an enable signal 608 is asserted. The high-performance squelch circuit 304 enters the high-power state only when the control signal 606 is negated. In particular, the high-performance squelch detector 308, and the OOB signal detector 310, enter the high-power state only when the control signal 606 is negated. The enable signal 608 can represent, for example, a link status of the SATA link providing the differential communication signal 214 signal.

Various embodiments of the present disclosure can be implemented in digital electronic circuitry, or in computer hardware, firmware, software, or in combinations thereof. Embodiments of the present disclosure can be implemented in a computer program product tangibly embodied in a computer-readable storage device for execution by a programmable processor. The described processes can be performed by a programmable processor executing a program of instructions to perform functions by operating on input data and generating output. Embodiments of the present disclosure can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, processors receive instructions and data from a read-only memory and/or a random access memory. Generally, a computer includes one or more mass storage devices for storing data files. Such devices include magnetic disks, such as internal hard disks and removable disks, magneto-optical disks; optical disks, and solid-state disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits). As used herein, the term "module" may refer to any of the above implementations.

A number of implementations have been described. Nevertheless, various modifications may be made without departing from the scope of the disclosure. Accordingly, other implementations are within the scope of the following claims.

What is claimed is:

1. An apparatus comprising:
 a receiver connected to a communication line, wherein the receiver is configured to receive a communication signal on the communication line and recover data from the communication signal;
 a first squelch circuit configured to detect possible squelch signals in the communication signal, wherein the first squelch circuit comprises
  a first squelch detector configured to detect one of the possible squelch signals in the communication signal in response to an amplitude of the one of the possible squelch signals being greater than a first amplitude threshold;
  a signal detector configured to negate a first control signal in response to the first squelch detector detecting one of the possible squelch signals in the communication signal; and
  logic configured to negate a second control signal in response to
   i) the first control signal being negated, and
   ii) an enable signal being asserted,
 a second squelch circuit configured to
  i) selectively detect a squelch signal in the same communication signal,
  ii) operate in a low-power state in response to the first squelch circuit detecting none of the possible squelch signals in the communication signal, and
  iii) operate in a high-power state in response to the second control signal being negated,
 wherein the second squelch circuit comprises
  a second squelch detector arranged in parallel with the first squelch detector and receiving the communication signal in parallel with the first squelch detector, the second squelch detector configured to, while the second squelch circuit is operating in the high-power state, selectively detect the squelch signal in the communication signal based on an amplitude of the communication signal; and
  an out-of-band signal detector arranged in series with the second squelch detector, the out-of-band signal detector configured to, while the second squelch circuit is operating in the high-power state, selectively identify an out-of-band signaling sequence based on the detected squelch signal.

2. The apparatus of claim 1, wherein:
 the enable signal represents a link status of a link, and
 the link provides the communication signal to the apparatus.

3. The apparatus of claim 1, wherein the communication signal is selected from the group consisting of:
 a serial ATA (SATA) signal;
 a PCI Express (PCIe) signal; and
 a Universal Serial Bus (USB) signal.

4. One or more integrated circuits comprising the apparatus of claim 1.

5. An analog front end comprising the apparatus of claim 1.

6. The apparatus of claim 1, wherein the apparatus is otherwise compliant with the Serial ATA International Organization: Serial ATA Revision 3.0 specification.

7. The apparatus of claim 1 wherein the out-of-band signal detector is configured to identify the out-of-band signaling sequence based on minimum and maximum durations of elements of the detected squelch signal.

8. The apparatus of claim 1 wherein the second squelch detector is configured to, while the second squelch detector is operating in the high-power state, detect the squelch signal in the communication signal in response to the amplitude of the communication signal being greater than a lower amplitude threshold and less than an upper amplitude threshold, wherein the upper amplitude threshold is greater than the lower amplitude threshold.

9. The apparatus of claim 1 wherein the out-of-band signal detector is configured to selectively identify the out-of-band signaling sequence only while the second squelch circuit is operating in the high-power state.

10. A communications device comprising the analog front end of claim 5.

11. The apparatus of claim 8 wherein the first amplitude threshold is greater than the lower amplitude threshold and less than the upper amplitude threshold.

12. A method comprising:
 using a receiver connected to a communication line, receiving a communication signal on the communication line and recovering data from the communication signal;
 using a first squelch detector, detecting possible squelch signals in the communication signal in response to an amplitude of one of the possible squelch signals exceeding a first amplitude threshold;
 negating a first control signal in response to detecting one of the possible squelch signals in the communication signal;
 negating a second control signal in response to
  i) the first control signal being negated, and
  ii) an enable signal being asserted;
 using a second squelch detector arranged in parallel with the first squelch detector, selectively detecting a squelch signal using the same communication signal based on an amplitude of the communication signal;
 operating the second squelch detector in a low-power state in response to detecting none of the possible squelch signals in the communication signal in the first squelch detector;
 operating the second squelch detector in a high-power state in response to the second control signal being negated,
 wherein the detecting the squelch signal using the second squelch detector is performed only while operating the second squelch detector in the high-power state; and
 using an out-of-band signal detector arranged in series with the second squelch detector, in response to detecting the squelch signal in the communication signal, selectively identifying an out-of-band signaling sequence based on the detected squelch signal.

13. The method of claim 12, wherein:
 the enable signal represents a link status of a link, wherein the link provides the communication signal.

14. The method of claim 12, wherein the communication signal is selected from the group consisting of:
 a serial ATA (SATA) signal;
 a PCI Express (PCIe) signal; and
 a Universal Serial Bus (USB) signal.

15. The method of claim 12 wherein the identifying the out-of-band signaling sequence includes identifying the out-of-band signaling sequence based on minimum and maximum durations of elements of the detected squelch signal.

16. The method of claim 12 wherein the detecting the squelch signal includes, while operating the second squelch detector in the high-power state, detecting the squelch signal in the communication signal in response to the amplitude of the communication signal being greater than a lower amplitude threshold and less than an upper amplitude threshold, wherein the upper amplitude threshold is greater than the lower amplitude threshold.

17. The method of claim 12 wherein the selectively identifying the out-of-band signaling sequence is performed only while the second squelch detector is being operated in the high-power state.

18. The method of claim 16 wherein the first amplitude threshold is greater than the lower amplitude threshold and less than the upper amplitude threshold.

\* \* \* \* \*